US006548386B1

(12) United States Patent
Kondo et al.

(10) Patent No.: US 6,548,386 B1
(45) Date of Patent: Apr. 15, 2003

(54) METHOD FOR FORMING AND PATTERNING FILM

(75) Inventors: Ichiharu Kondo, Nagoya (JP); Yasuo Ishihara, Kariya (JP); Shuichi Nagahaka, Nishikasugai-gun (JP); Takeshi Miyajima, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 09/570,038

(22) Filed: May 12, 2000

(30) Foreign Application Priority Data

May 17, 1999 (JP) ............................................ 11-136190

(51) Int. Cl.⁷ .......................... H01L 21/28; H01L 21/44
(52) U.S. Cl. ....................................................... 438/572
(58) Field of Search ................................ 438/612, 572, 438/614

(56) References Cited

U.S. PATENT DOCUMENTS

| 5,465,009 A | * | 11/1995 | Drabik et al. ................ 257/723 |
| 5,656,858 A | | 8/1997 | Kondo et al. |
| 5,846,875 A | | 12/1998 | Haji |
| 6,232,136 B1 | * | 5/2001 | Zavracky et al. ............. 438/30 |

FOREIGN PATENT DOCUMENTS

| JP | 09022883 | 1/1997 |
| JP | 10050710 | 2/1998 |

OTHER PUBLICATIONS

Kondo and Takenaka, "Adhesion Measurement of Ti Thin Films on Si Substrate Using Internal Stress in Overcoated Ni Film," J. Vac. Sci. Technol., A12(1), Jan./Feb. 1994, pp. 169–173.

* cited by examiner

Primary Examiner—Richard Elms
Assistant Examiner—Michael K. Luhrs
(74) Attorney, Agent, or Firm—Posz & Bethards, PLC

(57) ABSTRACT

Metallic films are formed on a silicon substrate on which an insulation film and a conductive portion are exposed. The metallic films include a first metallic film directly contacting the insulation film and the conductive portion and a second metallic film disposed on the first metallic film as a stress adjustment film to control a stress at an interface between the first metallic film and the underlying member. Accordingly, an adhesion between the first metallic film and the insulation film can be controlled to be smaller than that between the first metallic film and the conductive portion. Then, the metallic film is removed from the insulation film by an adhesive sheet selectively while remaining on the conductive portion. As a result, the metallic film can be patterned stably and readily at low cost.

48 Claims, 14 Drawing Sheets

METHOD FOR FORMING AND PATTERNING FILM

CROSS REFERENCE TO RELATED APPLICATION

This application is based upon and claims the benefit of Japanese Patent Application No. 11-136190 filed on May 17, 1999, the contents of which are incorporated herein by reference.

BACKGROUND OF THE INVENTION

1. Field of the Invention

This invention relates generally to a method for manufacturing a semiconductor device, and particularly to a method for forming and patterning a film on a substrate.

2. Description of the Related Art

A patterning method utilizing photolithography is conventionally used to form a metallic electrode of a semiconductor device. Accordingly, the electrode can be disposed on a desirable region. JP-A-10-64912 proposes another patterning method for a flip-chip process. In the process, when an under bump metallic film (herebelow, referred to as UBM film) is formed for a Cu bump, the UBM film is selectively removed by an adhesive sheet utilizing a difference in adhesion between a protective film and an underlying electrode.

The patterning method utilizing photolithography, however, necessitates equipments for photolithography and etching steps, resulting in extremely high process cost. In the method for selectively removing the UBM film by the adhesive sheet, it is difficult to perform the separation of the adhesive sheet stably.

SUMMARY OF THE INVENTION

The present invention has been made in view of the above problems. An object of the present invention is to provide a method for forming and patterning a film readily and stably at low cost.

According to the present invention, a member having a first surface portion made of a first material and a second surface portion made of a second material different from the first material is prepared, and a film is formed on the first and second surface portions of the member to have a total stress which controls a difference between a first adhesion of the film with respect to the first surface portion and a second adhesion of the film with respect to the second surface portion. Then, the film is removed from the first surface portion while remaining on the second surface portion. The film can be patterned readily and stably at low cost.

Preferably, the first material is an insulation material, the second material is one of metal, silicon, and silicon nitride, and the film is a metallic film. Preferably, the film includes a first film contacting the member, and a second film disposed on the first film as a stress adjustment, thereby controlling the total stress.

BRIEF DESCRIPTION OF THE DRAWINGS

Other objects and features of the present invention will become more readily apparent from a better understanding of the preferred embodiments described below with reference to the following drawings, in which.

DETAILED DESCRIPTION OF THE PREFERRED EMBODIMENTS

First Embodiment

FIGS. 1A to 1D show a manufacturing method of a semiconductor device in a first preferred embodiment. The semiconductor device is a so-called power element, a detailed constitution of which will be explained later.

Figure 1A:
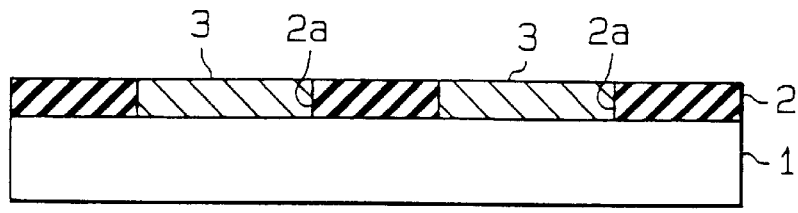
FIGS. 1A to 1D are cross-sectional views showing a method for manufacturing a semiconductor device in a first preferred embodiment of the present invention.

First, as shown in FIG. 1A, a silicon substrate 1 is prepared at a wafer state. Elements such as transistors not shown are formed in the silicon substrate 1 by a generally known semiconductor device manufacturing technique. Further, an insulation film 2 is formed on the silicon substrate 1 by a CVD method or the like. The insulation film 2 is composed of a BPSG (Boron-Phosphorus Silicate Glass)

film or a PSG (Phosphorus Silicate Glass) film. Opening portions 2a are formed in the insulation film 2 by a photolithography technique to provide electrical communication with an inside (bulk portion) of the silicon substrate 1.

Successively, an aluminum thin film 3 is deposited by a sputtering method or a deposition method not only on the insulation film 2 but in the opening portions 2a. The aluminum thin film 3 contains aluminum as a main component. After that, unnecessary portions of the aluminum thin film 3 are removed by the photolithography technique. The remaining aluminum thin film 3 forms electrode portions for the elements such as the transistors.

Accordingly, the electrode portions (aluminum thin film) 3 and the insulation film 2 are exposed on the silicon substrate 1. A heat treatment is then performed to provide sufficient electrical communication between the silicon substrate 1 and the aluminum thin film 3. A barrier metal layer may be formed between the silicon substrate 1 and the aluminum thin film 3 to prevent alloy spikes from being produced due to mutual diffusion between the substrate 1 and the aluminum thin film 3.

Figure 1B:
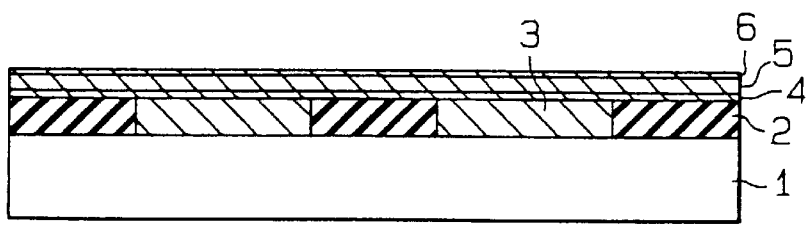
Figure 2:
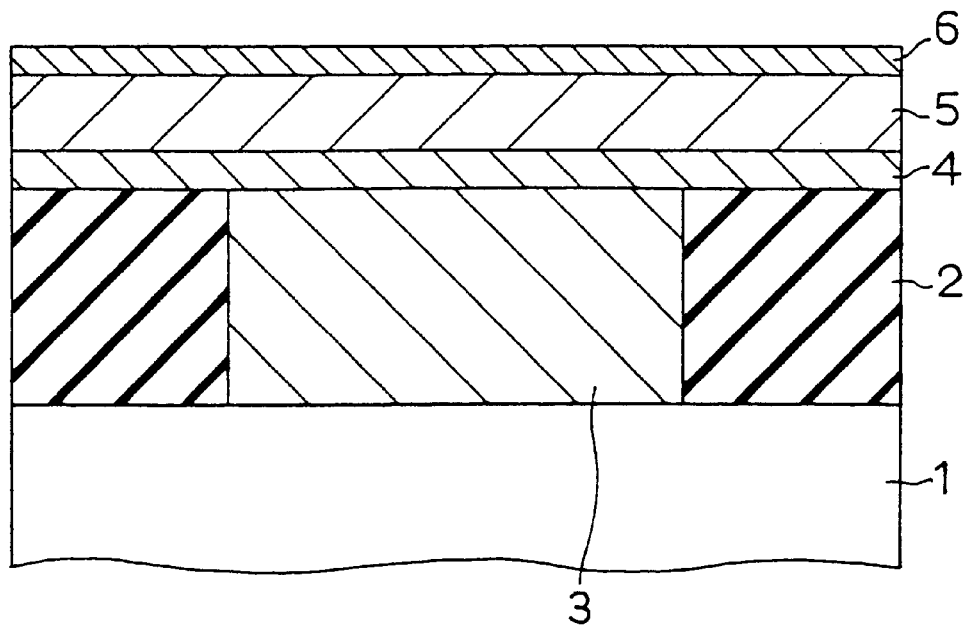
FIG. 2 is an enlarged cross-sectional view showing a state corresponding to that shown in FIG. 1B.

Successively, as show n in FIG. 1B, first, second, and third metallic films 4, 5, and 6 are deposited on the wafer state silicon substrate 1 in this order. FIG. 2 shows an enlarged view of the films 4, 5, and 6. The first metallic film 4 is made of titanium to be sufficiently bonded to the aluminum thin film 3, but may be made of other metals such as vanadium, chromium, cobalt, zirconium, aluminum, tantalum, tungsten, platinum, or nitrides of these metals, in addition to titanium provided that it can be sufficiently bonded to the thin film. Because an oxide film is naturally formed on the aluminum thin film 3, the oxide film needs to be removed before the metallic films are deposited on the thin film 3. However, in the case where the first metallic film is made of titanium as in the present embodiment, titanium deoxidizes the oxide film to thereby be oxidized. As a result, a preferable interface can be provided. It is not necessary to perform the oxide film removal step.

In FIG. 2, the second metallic film 5 is to adjust stress applied to an interface between the underlying metallic film 4 and the substrate 1 (insulation film 2), and is made of nickel. The second metallic film 5 may be made of other metals such has copper, palladium, or alloys containing at least one of these metals as a main component, in addition to nickel, provided that it can achieve the above object. The adhesion between the insulation film 2 and the metallic film 4 can be reduced due to the metallic film 5 in the following step into a detachable range. As a result, the detachment of the metallic film 4 from the insulation film 2 can be performed readily. Incidentally, a total stress of the first metallic film 4 and the second metallic film (stress adjustment film) 5 is approximately more than 10 N/m. The total stress is stress per unit width of the film, and is represented by a formula of thickness×internal stress.

The third metallic film 6 has good wettability to solder. The metallic film 6 is made of gold (Au), but may be made of other metals such as copper, silver, platinum, iron, tin, or nickel-vanadium alloy. When the metallic film 5 is made of metal such as nickel having sufficient wettability to solder, the metallic film 6 can be omitted. Even in such a case, however, the metallic film 6 is preferably formed, because the wettability of the nickel thin film to solder deteriorates when the surface of the nickel thin film is oxidized.

Figure 3:
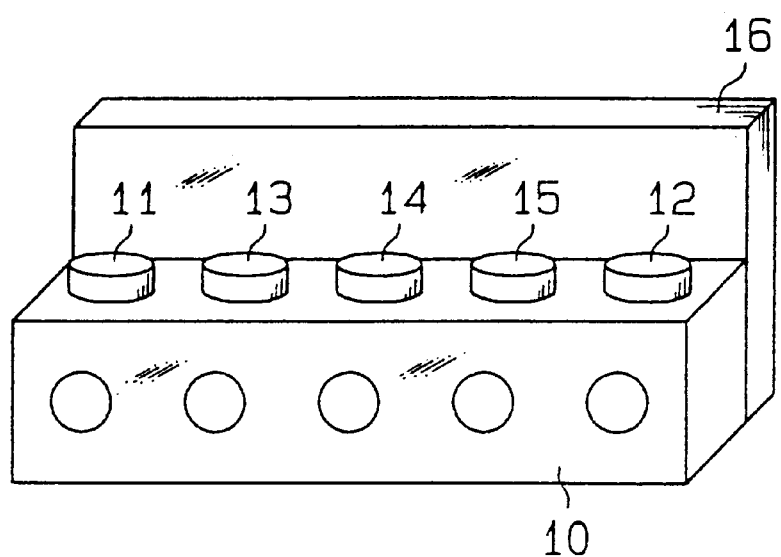
FIG. 3 is a perspective view for explaining a deposition apparatus.

The three metallic films 4, 5, and 6 are deposited in a sputtering apparatus shown in FIG. 3 under vacuum successively not to be exposed to atmospheric air during the deposition. Referring to FIG. 3, a vacuum chamber 10 has a wafer inlet 11 at one end portion thereof, and a wafer outlet 12 at the other end portion thereof. Three targets 13, 14, and 15 respectively for forming the first, second, and third metallic films 4, 5, and 6 are disposed in the chamber 10. The apparatus can deposit the three films 4, 5, and 6 on the wafer (substrate 1) while transporting the wafer therein. A control panel 16 is disposed adjacently to the vacuum chamber 10. No oxide film is formed between the metallic thin films, which are formed by the apparatus shown in FIG. 3, resulting in increased adhesion between the metallic films. The metallic films 4, 5, and 6 laminated with one another behave as one metallic film. The apparatus for forming the metallic films 4, 5, and 6 are not limited to that shown in FIG. 3, but may be other apparatuses for sputtering, deposition, or the like, provided that the films 4, 5, and 6 can be formed successively under vacuum.

Figure 1C:
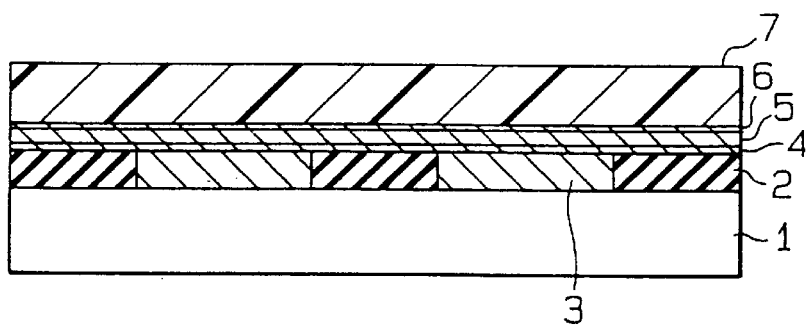
Figure 1D:
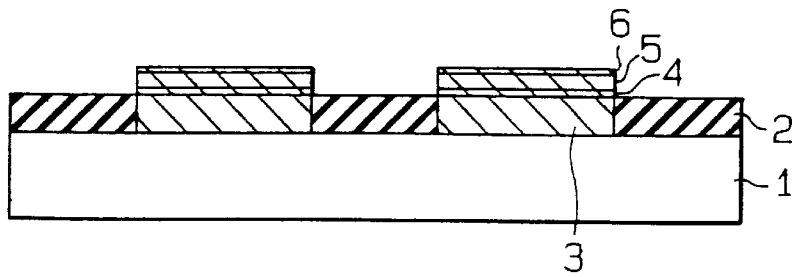
Figure 4:
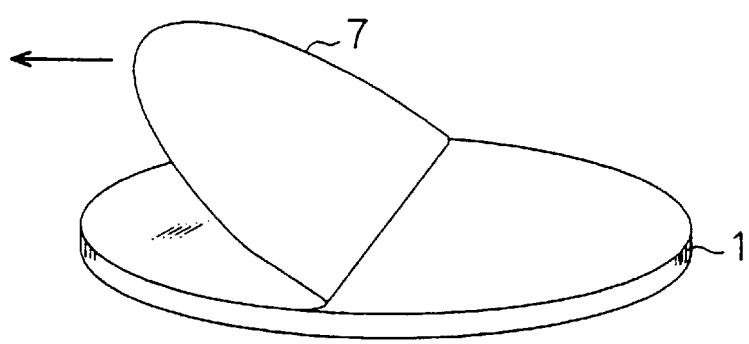
FIG. 4 is a perspective view for explaining a step of stripping an adhesive sheet.
Figure 5:
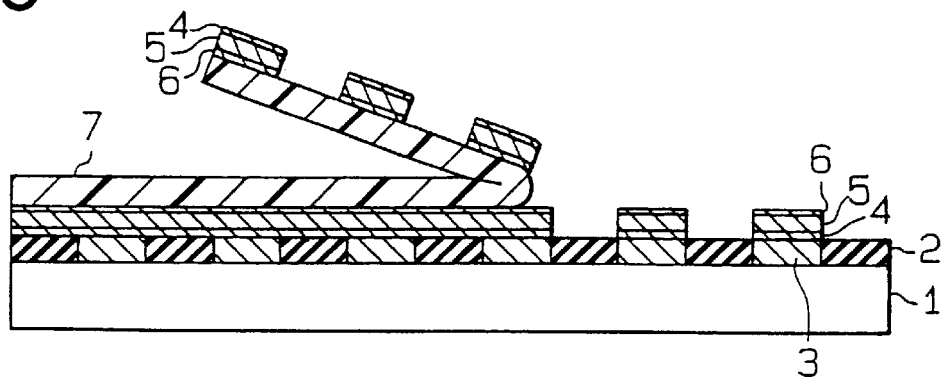
FIG. 5 is a cross-sectional view for explaining the step of stripping the adhesive sheet.

After the metallic films 4, 5, and 6 are formed, the wafer state silicon substrate 1 is taken out of the sputtering apparatus shown in FIG. 3, and is fixed by a vacuum chuck or the like. Then, as shown in FIG. 1C, an adhesive sheet (adhesive film) 7 is adhered onto the metallic film 6 not to produce any spaces therebetween. Next, as shown in FIG. 4, the adhesive sheet 7 is stripped from the wafer state substrate 1 gently. At that time, as shown in FIG. 5, portions of the metallic films 4, 5, and 6 disposed on the insulation film 2 are removed from the substrate 1 together with the adhesive sheet 7. The other portions of the metallic films 4, 5, and 6 disposed on the aluminum thin film 3 remain on the substrate 1. Accordingly, as shown in FIG. 1D, the unnecessary portions of the metallic films 4, 5, and 6 are removed from the substrate 1 (semiconductor device) readily.

In FIG. 4, the adhesive sheet 7 is cut into a shape substantially the same as that of the wafer state silicon substrate 1. Accordingly, the substrate 1 to which the adhesive sheet 7 is attached can be transported and temporarily stored readily. If the substrate 1 needs not be transported or temporality stored, the shape of the adhesive sheet 7 needs not be always the same as that of the substrate 1. Especially when the substrate 1 needs not be stored, the size of the adhesive sheet 7 is preferably larger than that of the substrate 1 so that the adhesive sheet 7 can be stripped from the substrate 1 readily.

The step of stripping the adhesive sheet 7 will be explained in more detail below.

The first metallic film 4 is made of titanium, which is bonded sufficiently not only to the aluminum thin film 3 but also to the insulation film 2. Therefore, it is usually difficult to separate the titanium thin film 4 from the insulation film 2. However, when the nickel thin film 5 is deposited on the titanium thin film 4 as shown in FIG. 2, separation of the titanium thin film 4 from the insulation film 2 becomes easy due to the following reason.

When the nickel thin film 5 is deposited on the titanium thin film 4 directly, large membrane stress (tensile stress) is produced in the nickel thin film 5 due to differences in modulus of rigidity and in thermal expansion coefficient during the deposition. Specifically, titanium has a thermal expansion coefficient close to those of aluminum and silicon, whereas nickel has a thermal expansion coefficient larger than that of titanium. Tensile stress remains in the nickel thin film 5 when temperature is lowered from 150° C. to room temperature. When the thickness of the titanium thin film 4 is approximately 500 nm or less and the no oxide film exists between the titanium thin film 4 and the nickel thin film 5, the tensile stress in the nickel thin film 5 affects the interface between the titanium thin film 4 and the insulation film 2, so that the adhesion between the titanium thin film 4 and the insulation film 2 is decreased to fall in a detachable range in which the insulation film 2 can be separated.

Thus, only the electrode member disposed on the insulation film 2 can be stably removed by utilizing the internal stress of the metallic electrode thin films 4, 5, and 6 and the difference in adhesion with the underlying material. Incidentally, the titanium thin film 4 is not separated from silicon oxide ($SiO_2$) by heat treatment as a cupper film disclosed in JP-A-10-64912. Because of this, the stress of another film is utilized to separate the metallic film from silicon oxide in the present embodiment.

Figure 6:
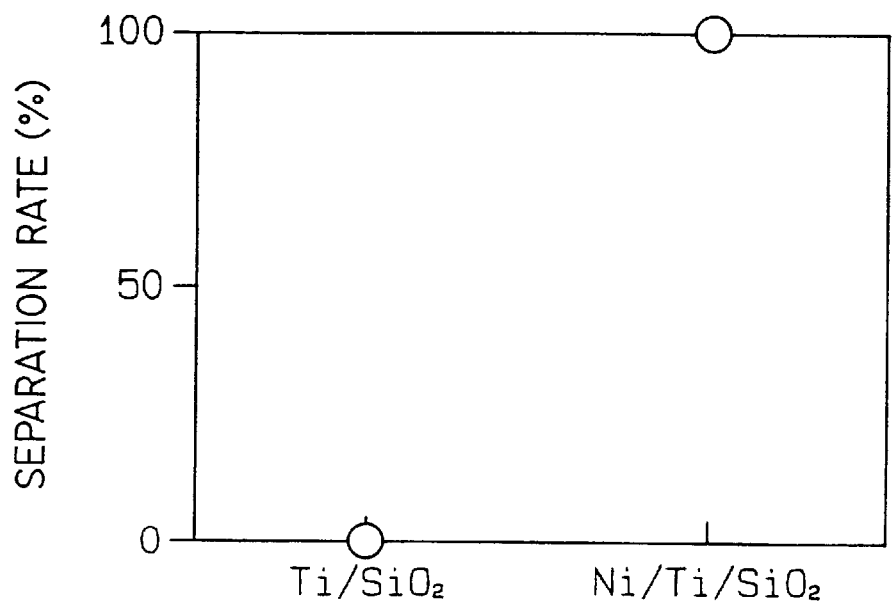
FIG. 6 is a graph showing experimental results of separation rates evaluated by a tape test.

As shown in FIG. 6, since a titanium thin film used as an electrode has high adhesion with respect to a silicon oxide ($SiO_2$) film, no separation occurs by a separation test using an adhesive tape when only the titanium thin film is disposed on the silicon oxide film. As opposed to this, when a nickel thin film is deposited on the $Ti/SiO_2$ laminating films to form a $Ni/Ti/SiO_2$ structure and to apply a total stress of approximately 100 N/m, the adhesive tape can cause the separation.

Figure 7:
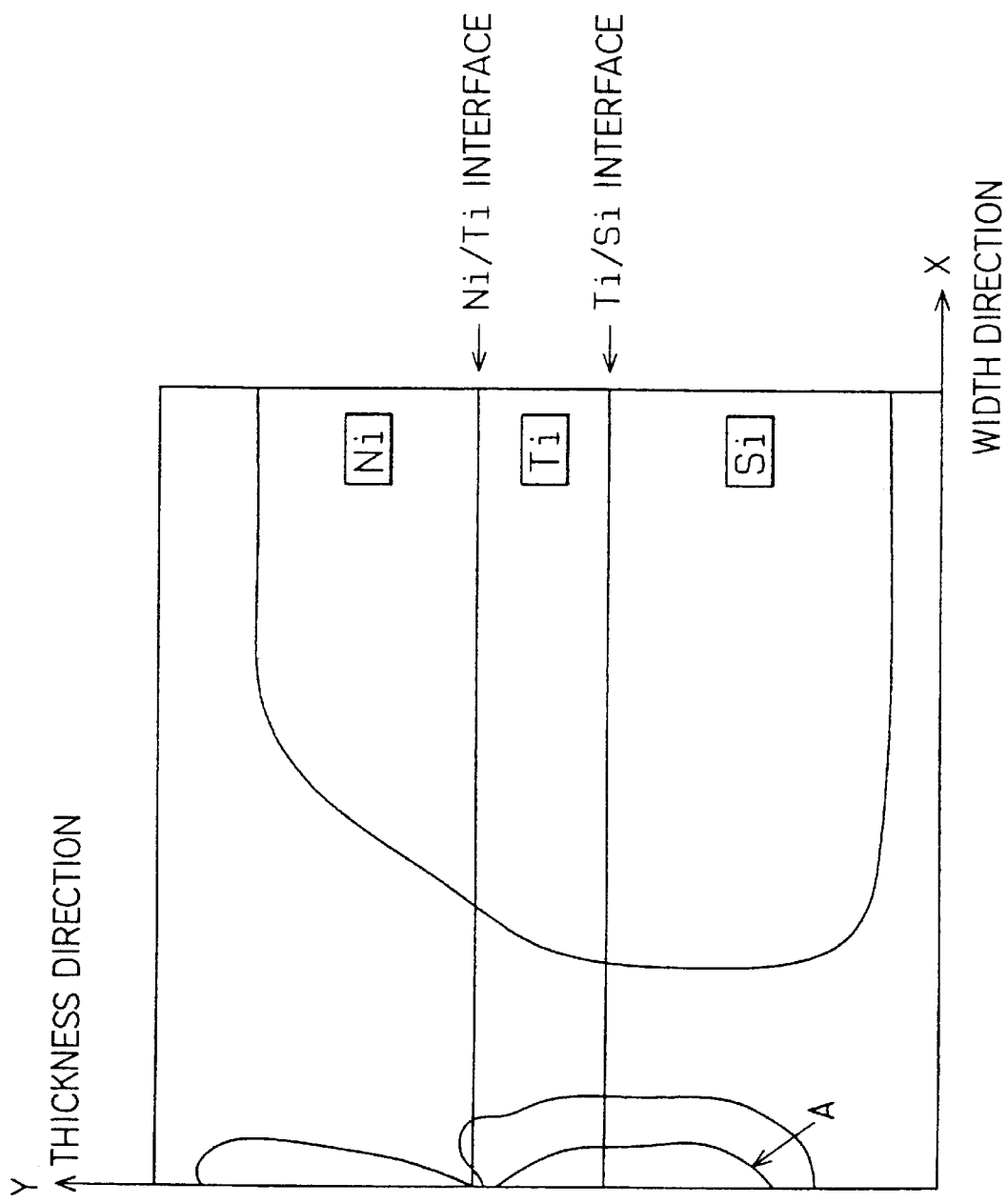
FIG. 7 is a stress distribution obtained by a finite element method.

The reason of this phenomenon is revealed by a calculation result of a finite element method (I. Kondo, J. Vac. Sci. Technol. A12(1), 169, 1994) shown in FIG. 7. In FIG. 7, region A has stress the largest of all. That is, tensile stress existing in the Ni film formed by sputtering causes large tensile stress at the interface between the titanium thin film and the underlying layer (silicon substrate in FIG. 7). The large tensile stress makes the separation at the Ti/Si interface possible. In FIG. 7, the silicon substrate underlies the titanium thin film. This structure corresponds to that in a second embodiment described below.

Figure 8:
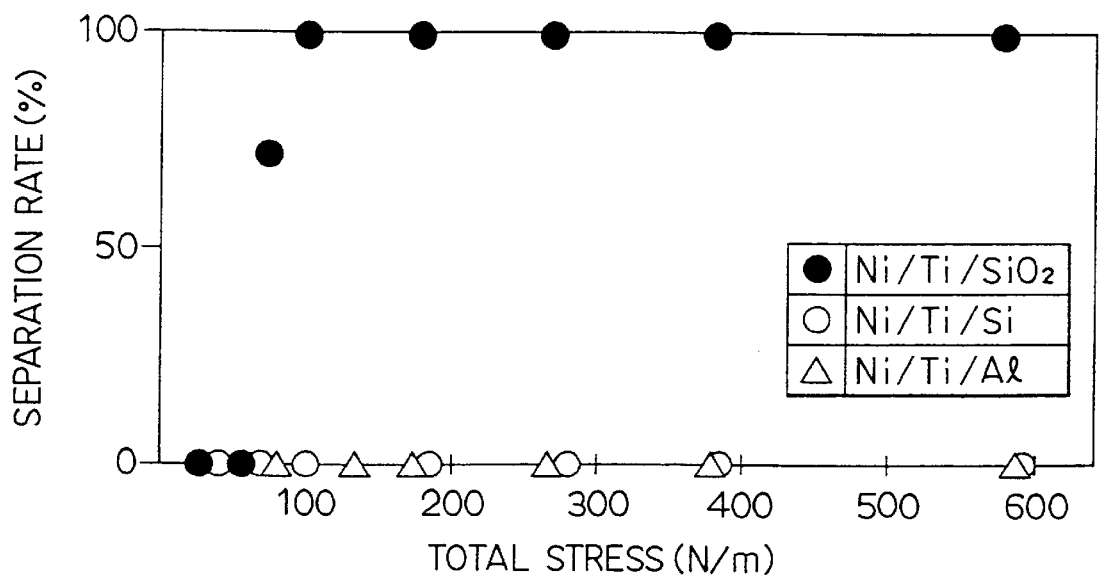
FIG. 8 is a graph showing experimental results of separation rates evaluated by a tape test.

Next, adhesions between the titanium thin film 4 and the insulation (SiO2) film 2 and between the titanium thin film 4 and the aluminum thin film 3 were evaluated as separation rates measured by an adhesive tape test while changing a total stress. The results are shown in FIG. 8. The aluminum thin film 3 does not undergo a pretreatment, which is performed to remove an aluminum oxide film from the aluminum thin film.

According to FIG. 8, it is confirmed that when the total stress is 100 N/m or more, separation occurs on the silicon oxide film. As opposed to this, separation does not occur on the aluminum thin film even when the total stress is 380 N/m. Therefore, for instance, when the total stress is 300 N/m, the titanium thin film can remain selectively on the aluminum thin film to which the pretreatment is not performed. The adhesion between the metallic thin film 4 and the insulation film 2 is smaller than that between the metallic thin film 4 and the aluminum thin film 3. When the total stress is 100 N/m or more and the adhesive sheet 7 is stripped to remove the metallic thin film 4, the metallic thin film 4 is removed selectively from the insulation film 2 together with the adhesive sheet 7, but is not removed from the aluminum thin film 3. As a result, the metallic thin film 4 remains only on the aluminum thin film 3.

The total stress of the laminated films 4, 5 can be controlled by the thickness of the nickel thin film 5 mainly. The larger the total stress becomes, the easier the separation from the insulation film 2 becomes. However, the total stress of approximately 1500 N/m or more may warp and damage the wafer especially when the wafer is thin. Therefore, it is preferable to control the total stress in a range of 100 N/m to 1500 N/m. As a result, warp and damages of the wafer are prevented from being produced after the films are deposited.

Figure 9:
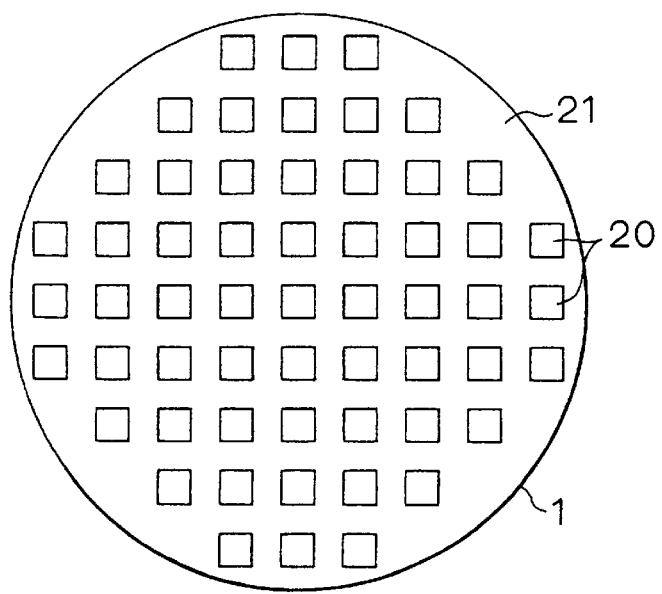
FIG. 9 is a schematic plan view showing a wafer with removal regions in a modified embodiment.
Figure 10:
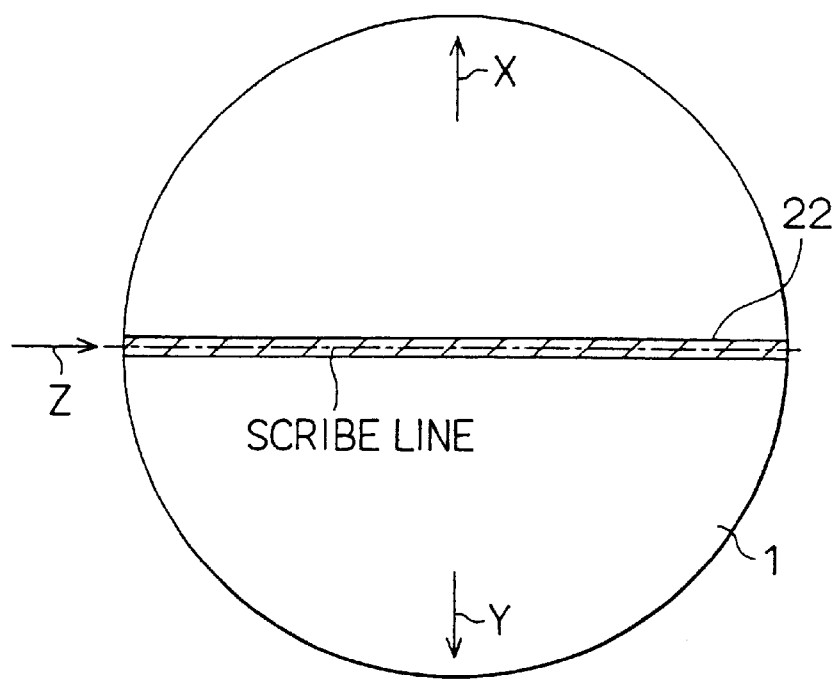
FIG. 10 is a schematic plan view showing a wafer with removal regions in another modified embodiment.
Figure 11:
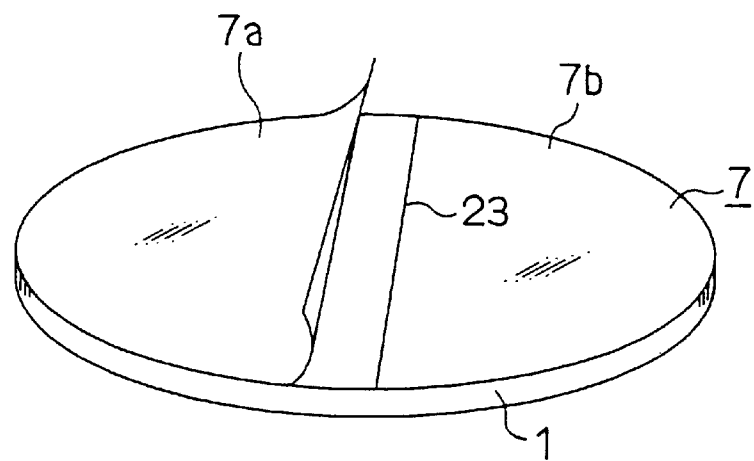
FIG. 11 is a perspective view for explaining an adhesive sheet in the modified embodiment shown in FIG. 10.

The removal of the metallic films 4, 5, and 6 by the adhesive sheet 7 can be performed more readily as shown in FIGS. 9, 10, and 11.

In FIG. 9, a wafer (substrate 1) has plural element formation regions 20 each for forming a semiconductor device. Vicinal regions of the element formation regions 20 and an outer peripheral region of the wafer are removal regions 21 from which the metallic films are removed by the adhesive sheet. All of the removal regions 21 are integrally connected to one another. Therefore, when the adhesive sheet 7 is stripped from the wafer, the separation of the films starts from the outermost peripheral portion of the wafer and continues without intermittence. Because of this, burrs are hardly produced and the metallic film scan be removed uniformly.

Although FIG. 9 does not show specifically, each of the element formation regions 20 includes removal regions therein, some of which are independent, i.e., are not connected other removal regions. Once the separation starts, however, the independent removal regions in the element formation regions are also removed readily upon receiving a force from the vicinal region thereof caused by the separation.

When it is difficult to provide the removal regions 21 as shown in FIG. 9, as shown in FIG. 10, a removal region 22 may be provided along a scribe line extending in direction Z. In this case, the adhesive sheet 7 is stripped in the direction Z to make the start point of the separation clear. This also makes the separation easier. The adhesive sheet 7 may be stripped in a direction (X or Y) perpendicular to the scribe line. In this case, as shown in FIG. 11, the adhesive sheet 7 is cut along the removal region 22 to have a cut line 23. The cut line 23 divides the adhesive sheet 7 into two semi-circular portions 7a, 7b. Each of the semi-circular portions 7a, 7b can be stripped from the cut line 23 easily.

Figure 12A:
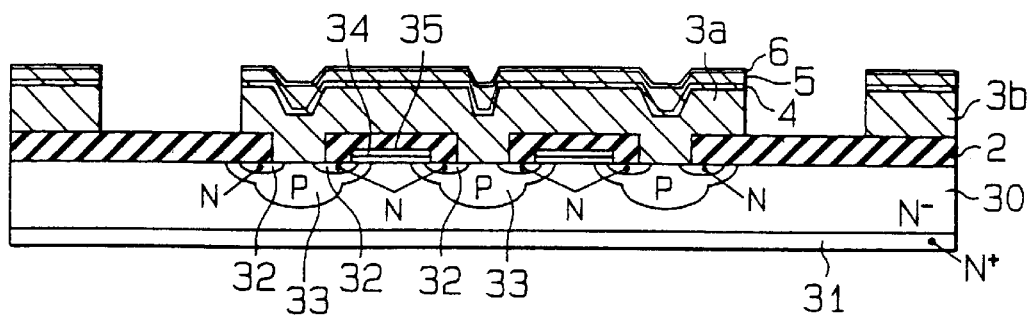
FIGS. 12A to 12C are cross-sectional views showing a method for manufacturing the semiconductor device in the first embodiment.
Figure 12B:
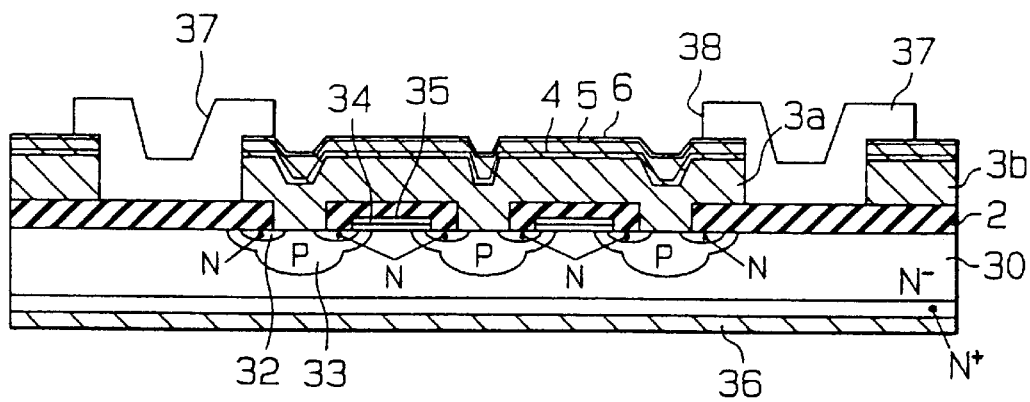
Figure 12C:
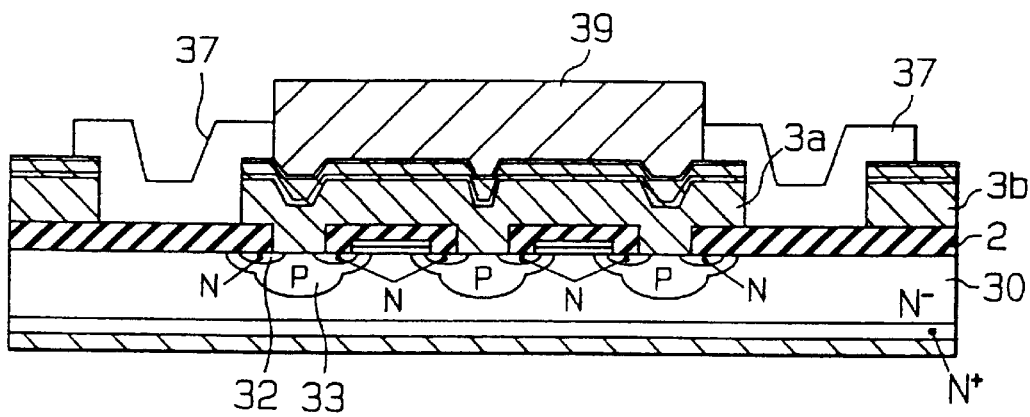

After the unnecessary portions of the metallic films 4, 5, and 6 are removed together with the adhesive sheet 7 as shown in FIG. 1D, steps shown in FIGS. 12A to 12C are performed. FIG. 12A corresponds to the state shown in FIG. 1D, and specifically show a transistor cell which is omitted in FIG. 1D. In FIG. 12A, an $N^+$ type region 31 is formed on a back surface of an $N^-$ type silicon substrate 30, and N type regions 32 and P type regions 33 are formed in a surface portion of the $N^-$ type substrate 30 at a side opposite the $N^+$ type region 31. A gate electrode 35 is formed above the $N^-$ type substrate 30 with a gate oxide film 34 interposed therebetween, thereby forming the transistor cell. The gate oxide film 34 and the gate electrode 35 are covered with the insulation film 2.

The aluminum thin film 3 disposed on the upper surface of the $N^-$ type substrate 30 includes aluminum thin film portions 3a, 3b. The aluminum thin film portion 3a is disposed on the $N^-$ type silicon substrate 30 to contact the N type regions 32 and the P type regions 33 as a source electrode. The aluminum thin film portion 3b is disposed on the $N^-$ type silicon substrate 30 as a wiring member. Each of the diffusion regions described above may have an opposite conductivity type of N type or P type. When the $N^+$ type region 31 is made to be a P+ type, an IGBT (Insulated Gate Bipolar Transistor) can be formed.

Then, as shown in FIG. 12B, a drain electrode 36 is formed on the back surface of the substrate 30. A protective film 37 is formed above the upper surface of the substrate 30, and an electrode portion 38 is opened in the protective film 37 by a photolithography method. Further, as shown in FIG. 12C, solder 39 is disposed on the aluminum thin film portion 3a with the metallic films 4, 5, and 6 interposed therebetween.

The present embodiment describe above has the following features.

As shown in FIGS. 1C and 1D, the portions of the metallic thin films 4, 5, and 6 deposited on the insulation film 2 are removed and the portions of the metallic thin films 4, 5, 5 deposited on the aluminum thin film 3 are not removed by stripping the adhesive sheet 7. This is made possible by the stress adjustment film 5, which reduces the adhesion between the insulation film 2 and the metallic thin film 4 in the range capable of performing the separation.

Specifically, the stress adjustment film 5 has tensile stress (or compressive stress) therein, and the tensile stress produces large stress at the interface between the metallic thin film 4 and the underlying member, thereby making possible the separation of the metallic thin film 4 from the underlying member at the interface. It is not necessary to use equipments for photolithography and etching steps as in the conventional method, thereby realizing low process cost. The separation can be performed in a stable manner as compared to the conventional method for selectively removing a UBM film.

Incidentally, immediately after the metallic thin film 4 is deposited, both adhesions between the aluminum thin film 3 and the metallic thin film 4 and between the insulation film 2 and the metallic thin film 4 are so large that the metallic thin film 4 cannot be separated not only from the aluminum thin film 3 but also from the insulation film 2.

Figure 13:
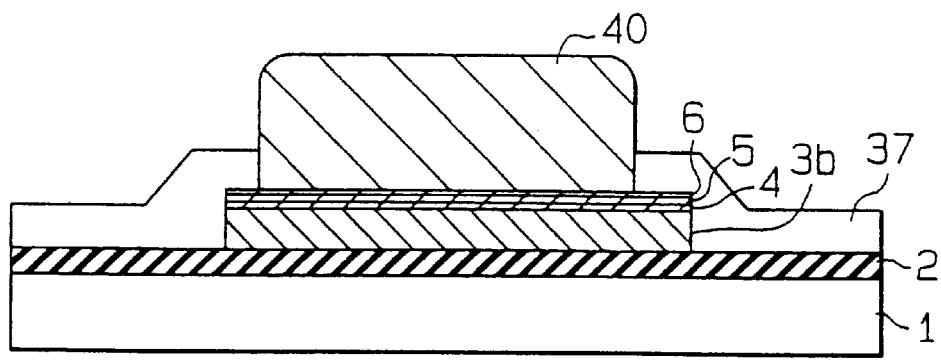
FIG. 13 is a cross-sectional view showing the semiconductor device in the first embodiment.

In FIG. 12C, the solder 39 is disposed on the metallic thin film 6, which has sufficient wettability to the solder 39, above the transistor cell. However, as shown in FIG. 13, solder 40 may be disposed on the aluminum thin film portion 3b as a wiring member excluded from the transistor cell. In this case, the aluminum thin film portion is usable as a UBM for a bump of an element for mounting a flip chip thereon, in addition to the power device. FIGS. 12A to 12C and 13 show the element (chip) holding the solder 39 or 40 only on one surface of the element. However, solder may be disposed on both surfaces of an element so that the element can be mounted (molded) while being interposed between two conductive members such as metallic frame portions through the solder on the both surfaces thereof.

Figure 14:
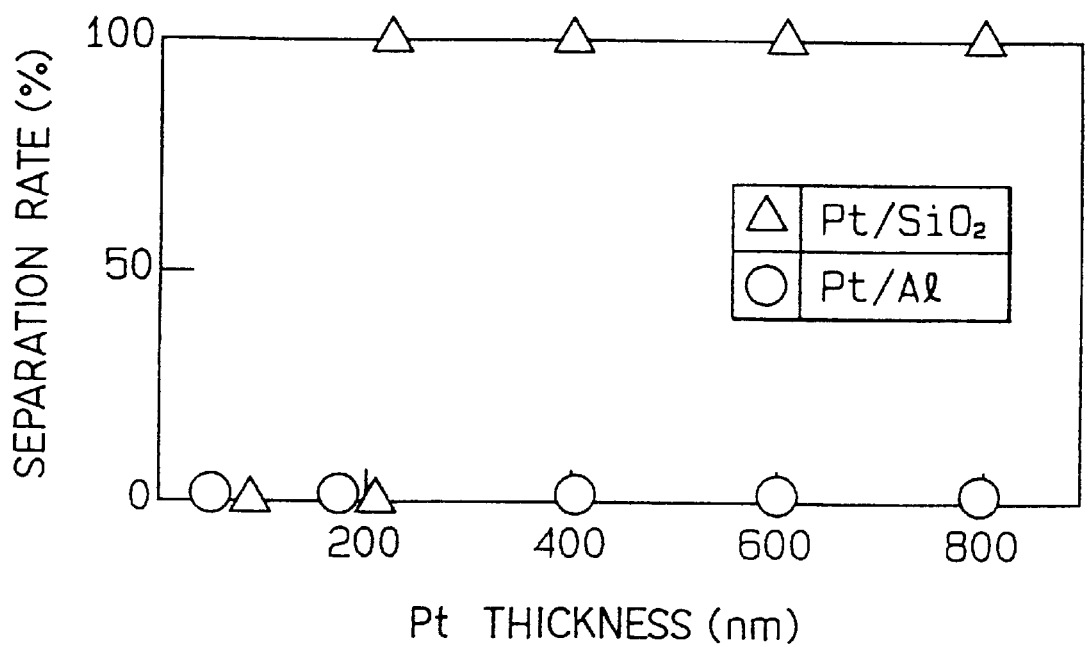
FIG. 14 is a graph showing experimental results of separation rates evaluated by a tape test.

After the metallic film 4 disposed on the insulation film 2 is removed, the stress adjustment film 5 may be removed. When the metallic thin film 4 is made of platinum, it may be possible to dispense with the metallic thin films 5, 6. This is because platinum itself has large intrinsic stress and lower adhesion with respect to the insulation film than the other metallic films. FIG. 14 shows separation rates, in accordance with a thickness of a platinum (Pt) film, between the Pt film and the aluminum (Al) film and between the Pt film and the $SiO_2$ film. As shown in FIG. 14, it is known that the Pt film having a thickness of approximately 220 nm or more is separated from the $SiO_2$ film. This implies that the Pt film can be selectively removed from the insulation film without the metallic film 5 disposed thereon. In addition, since the Pt film can be soldered directly, the metallic film 6 needs not be formed thereon.

Second Embodiment

Next, a second preferred embodiment will be explained focusing on differences from the first embodiment.

FIGS. 15A to 15E show a method for manufacturing a diode in the second embodiment in a stepwise manner. In the first embodiment, the aluminum thin film 3 is formed for forming electrodes and wiring members, and the metallic thin film 4 is deposited on the aluminum thin film 3. In this embodiment, the metallic thin film 4 is deposited on an N type impurity diffusion region 51 formed in a surface portion of a P type silicon substrate 50 directly.

Figure 15A:
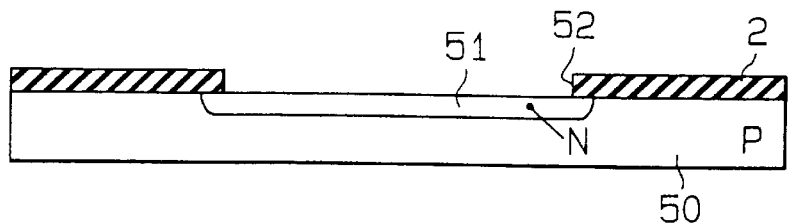
FIGS. 15A to 15E are cross-sectional views showing a method for manufacturing a semiconductor device in a second preferred embodiment of the present invention.

As shown in FIG. 15A, the N type impurity diffusion region 51 is formed in the wafer state P type silicon substrate 50 by an ordinal semiconductor device manufacture technique. Accordingly, a diode having a PN junction is provided. Then, as in the first embodiment, the insulation film 2 is formed, and an opening portion 52 is formed in the insulation film 2 by a photolithography method. Further, a naturally oxidized film formed in the opening portion 52 is removed by hydrofluoric acid or the like.

Figure 15B:
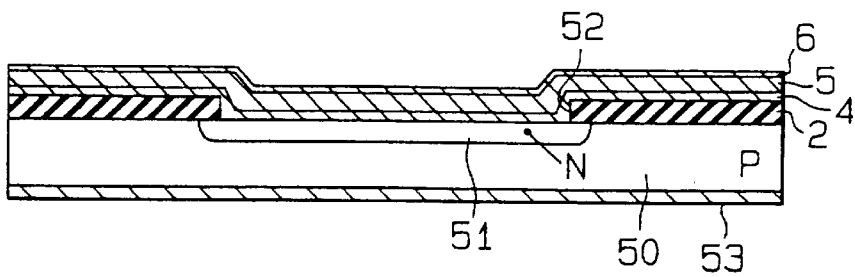
Figure 15C:
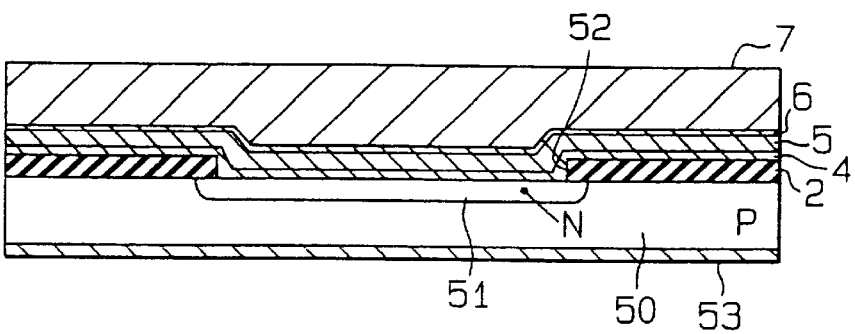
Figure 15D:
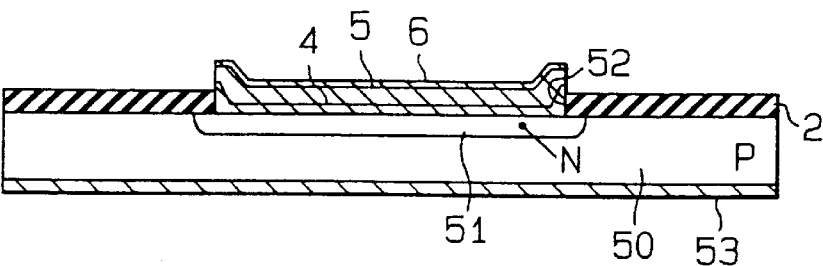
Figure 15E:
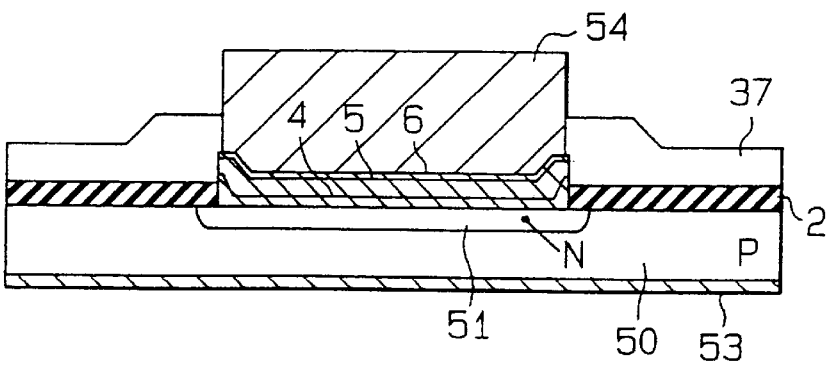

After that, as shown in FIG. 15B, the metallic thin films 4, 5, and 6 are deposited in this order without interposing the aluminum thin film. An electrode 53 is formed on the back surface of the silicon substrate 50. Successively, as shown in FIG. 15C, the adhesive sheet 7 is adhered to the metallic films 4, 5, and 6 on the silicon substrate 50. The adhesive sheet 7 is then stripped from the wafer state silicon substrate 50 substantially in the same manner shown in FIGS. 4 and 5. Accordingly, as shown in FIG. 15D, the metallic thin films 4, 5, and 6 remain only in the opening portion 52. Then, as shown in FIG. 15E, soldering is performed to the remaining metallic thin films 4, 5, and 6 entirely, thereby mounting solder 54 on the metallic thin films 4, 5, and 6.

Referring back to FIG. 8, FIG. 8 shows the adhesions between the titanium thin film and the insulation ($SiO_2$) film and between the titanium thin film and the silicon substrate, which were evaluated as separation rates measured by the adhesive tape test. The separation occurred on the $SiO_2$ film when the total stress was 100 N/m. As opposed to this, the separation did not occur on the silicon substrate even when the total stress was 380 N/m. Accordingly, it is known that the adhesion between the titanium thin film and the insulation film is smaller than that between the titanium thin film and the silicon substrate. The titanium thin film can be removed from the insulation film, but cannot be removed from the silicon substrate by the adhesive sheet 7 when the total stress is approximately 100 N/m or more.

FIGS. 15A to 15E show the element (chip) holding the solder 54 on one surface thereof. However, solder may be disposed on both surfaces of an element so that the element can be mounted (molded) while being interposed between two conductive members such as metallic frame portions through the solder on the both surfaces thereof.

Third Embodiment

Figure 16A:
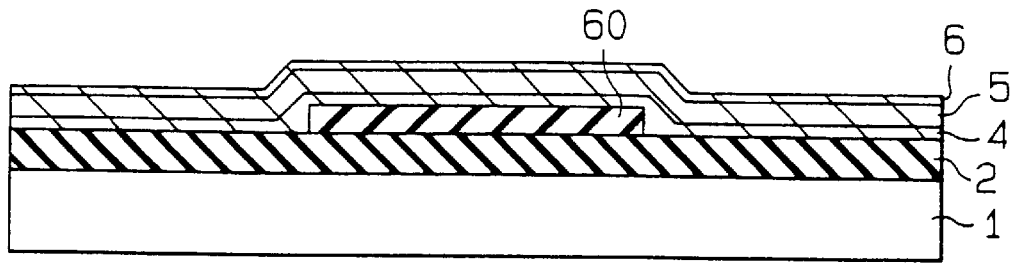
FIGS. 16A and 16B are cross-sectional views showing steps for manufacturing a semiconductor device in a third preferred embodiment of the present invention.
Figure 16B:
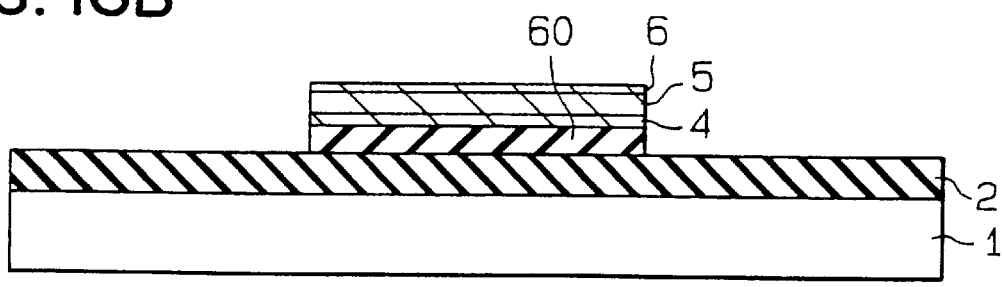

A third preferred embodiment will be explained focusing on differences from the second embodiment below. FIGS. 16A and 16B shows a method of manufacturing a semiconductor device in the third embodiment. FIGS. 16A and 16B show a portion for forming a circuit such as an LSI, which is different from but adjacent to the portion shown in FIG. 15D.

First, as shown in FIG. 16A, the silicon oxide film 2 is formed on the silicon substrate 1 by a thermal oxidation or CVD method. After elements such as transistors are formed, a silicon nitride film 60 is formed, and is patterned. Then, the metallic thin films 4, 5, and 6 are deposited in this order. The titanium thin film 4 has high adhesion with respect to the silicon nitride film 60. Therefore, the nickel thin film 5 can be thinned as compared to that in the first and second embodiments. Then, the metallic thin films 4, 5, and 6 are partially removed substantially in the same manner shown in FIGS. 4 and 5. Because the adhesion between the titanium thin film 4 and the silicon oxide film 2 is low, as shown in FIG. 16B, the metallic thin films 4, 5, and 6 remain only on the silicon nitride film 60. The LSO has a portion electrically communicating with silicon, and the portion has a structure substantially the same as that shown in FIG. 15D.

Figure 17:
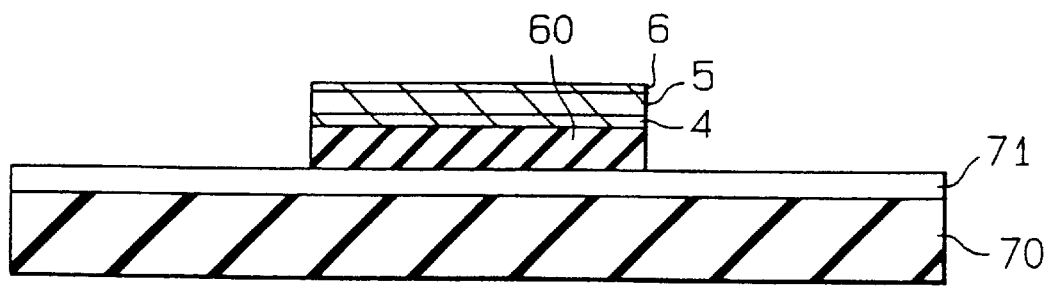
FIG. 17 is a cross-sectional view showing a modified semiconductor device in the third embodiment.

As shown in FIG. 17, the silicon substrate 1 may be replaced with an insulation substrate 70 such as a glass substrate. A semiconductor thin film 71 made of silicon or the like is formed on the insulation substrate 70, and elements such as transistors are provided in the semiconductor thin film 71. The silicon nitride film 60 is disposed on a specific region of the semiconductor thin film 71, and the metallic thin films 4, 5, and 6 are disposed only on the silicon nitride film 60. The technique described above referring to FIGS. 16A and 16B can also be applied to form the structure shown in FIG. 17. Thus, the present invention can be applied to substrates other than semiconductor substrates.

Fourth Embodiment

A fourth preferred embodiment of the present invention will be explained focusing on differences from the first embodiment below.

Figure 18A:
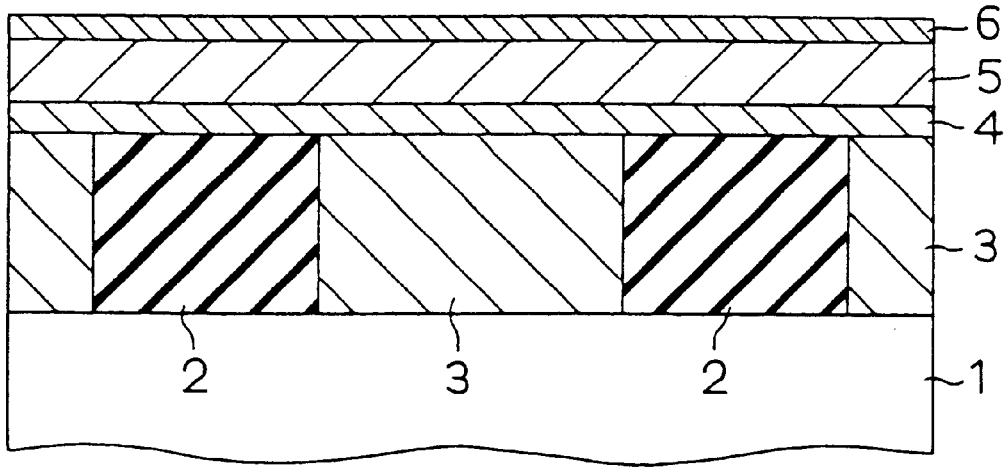
FIGS. 18A and 18B are cross-sectional views showing steps for manufacturing a semiconductor device in a fourth preferred embodiment of the present invention.
Figure 18B:
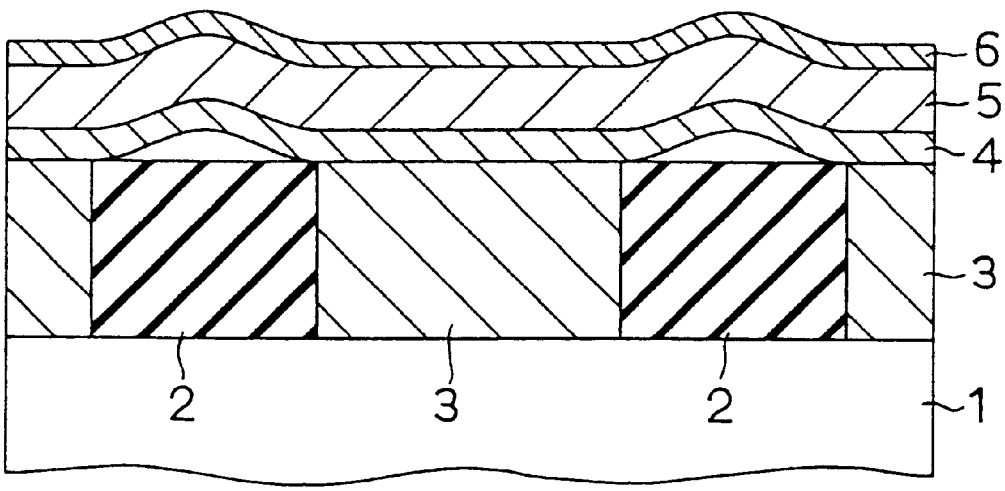

As shown in FIG. 18A, when the internal stress of the metallic films 4, 5, and 6 is extremely high, the adhesion between the metallic thin film 4 and the insulation film 2 is extremely small. As a result, as shown in FIG. 18B, the metallic thin films 4, 5, and 6 are naturally partially separated from the insulation film 2 to have deformed portions as if floating above the substrate 1. A pincette or the like can pinch the deformed portions to strip the metallic films 4, 5, and 6 from the substrate 1. As a result, the metallic films 4, 5, and 6 can be left only on the metallic film 3 without using an adhesive sheet.

This method is effective especially when the film underlying the metallic thin films 4, 5, and 6 is made of metal such as Au or Pt, which is very difficult to be oxidized. However, it is apparent that an adhesive sheet can remove the metallic thin films more readily and securely to pattern the electrode member even when the internal stress of the metallic films 4, 5, and 6 is extremely high.

Fifth Embodiment

Figure 19A:
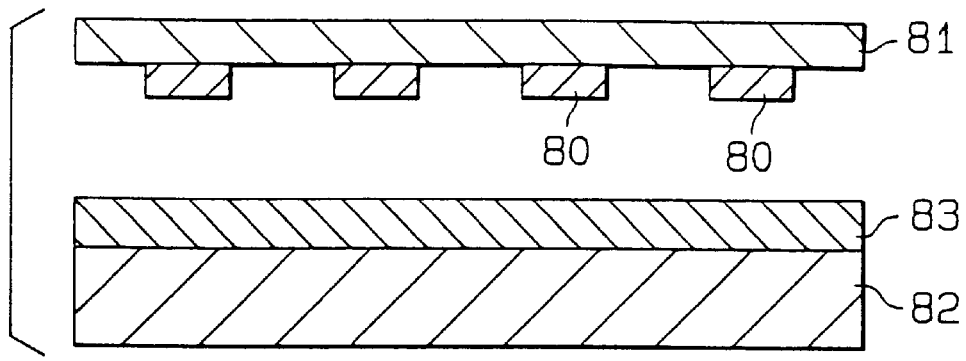
FIGS. 19A to 19C are cross-sectional views showing a method for manufacturing a semiconductor device in a fifth preferred embodiment of the present invention.
Figure 19B:
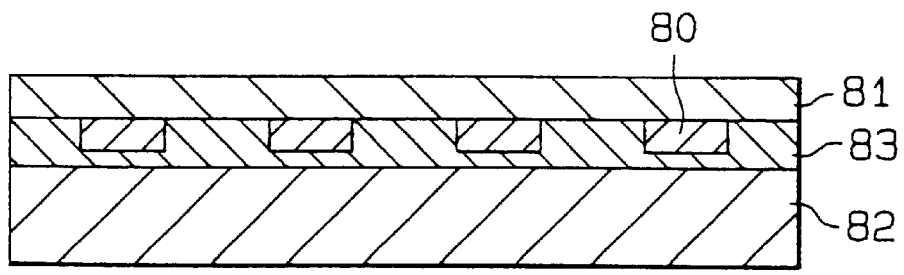
Figure 19C:
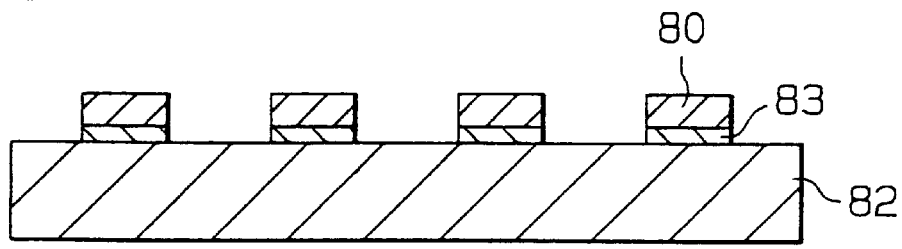
Figure 20A:
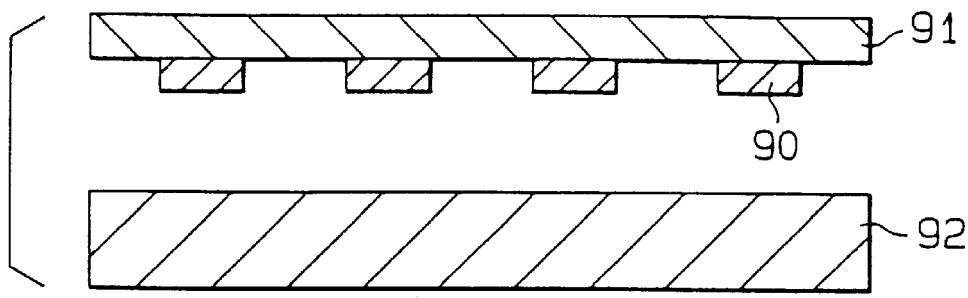
FIGS. 20A to 20D are cross-sectional views showing a method for manufacturing a semiconductor device as a modification of the fifth embodiment.
Figure 20B:
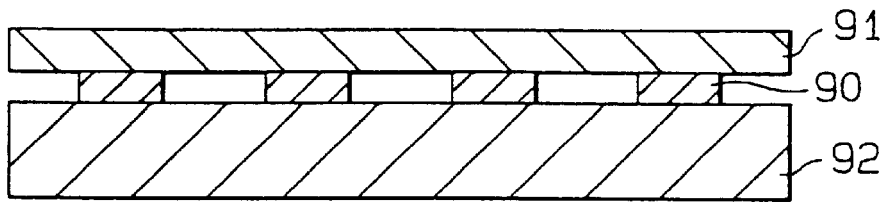
Figure 20C:
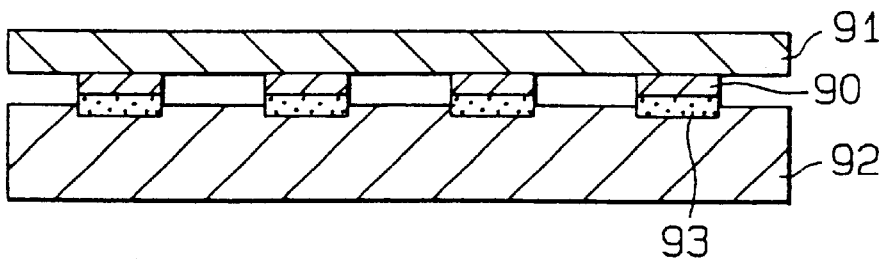
Figure 20D:
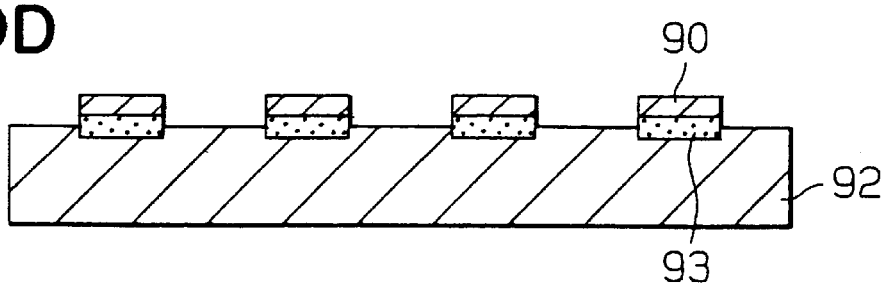

Next, a fifth preferred embodiment of the present invention will be explained focusing on differences from the fourth embodiment below. FIGS. 19A to 19C show a method for manufacturing a semiconductor device in the present embodiment. In the present embodiment, a metallic film 80, which has been naturally separated from a first substrate as in the fourth embodiment, is rearranged on a second substrate 82 by utilizing an adhesive sheet 81.

Specifically, as shown in FIG. 19A, the metallic film 80 having been naturally separated from the first substrate is bonded to the adhesive sheet 81 having a small adhesive strength. Adhesive 83 having an adhesive strength larger than that of the adhesive sheet 81 is coated on the wafer state second substrate 82. The adhesive 83 preferably has conductivity. Further, as shown in FIG. 19B, the metallic film 80 is bonded to the adhesive 83 while being supported by the adhesive sheet 81. After that, as shown in FIG. 19C, the adhesive sheet 81 is removed. As a result, the metallic film 80 is disposed on the substrate 82 with the adhesive 83 interposed therebetween. Thus, the metallic film 80 having been separated from the first substrate can be utilized for electrodes or wiring members for other elements.

Otherwise, as shown in FIG. 20, a metallic film 90 having been naturally separated from a first substrate is bonded to an adhesive sheet 90. Then, as shown in FIG. 20B, the metallic film 90 supported by the adhesive sheet 91 is bonded to a wafer state second substrate 92. Further, as shown in FIG. 20C, a heat treatment is carried out to form a compound (silicide) layer 93 between the substrate 92 and the metallic film 90. After that, as shown in FIG. 20D, the adhesive sheet 91 is removed. As a result, the metallic film 90 is arranged on the second substrate 92 through the compound layer 93 interposed therebetween.

Sixth Embodiment

A sixth preferred embodiment of the present invention will be explained focusing on differences from the fifth embodiment. FIGS. 21A to 21E show a method for manufacturing a semiconductor device in the sixth embodiment in a stepwise manner. In the present embodiment, a metallic film pattern 100, which has been naturally separated from a first substrate as in the fourth embodiment, is transferred to a second substrate 102 by utilizing an adhesive sheet 101.

Figure 21A:
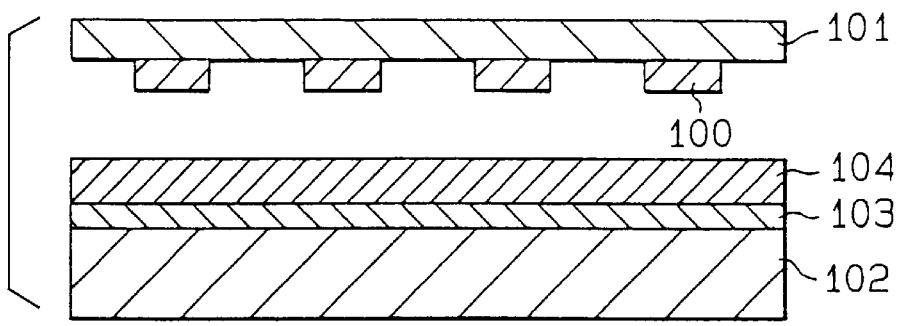
FIGS. 21A to 21E are cross-sectional views showing a method for manufacturing a semiconductor device in a sixth preferred embodiment of the present invention.
Figure 21B:
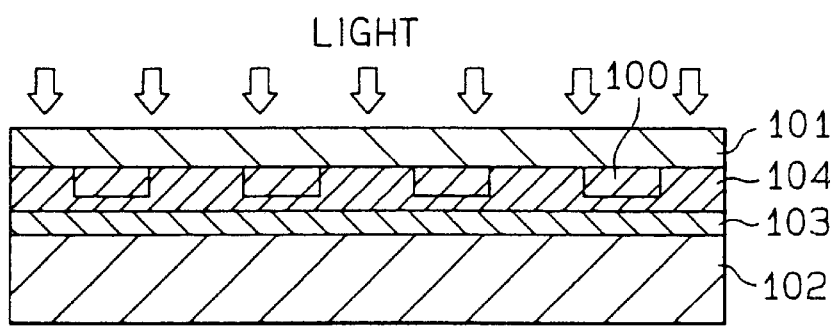
Figure 21C:
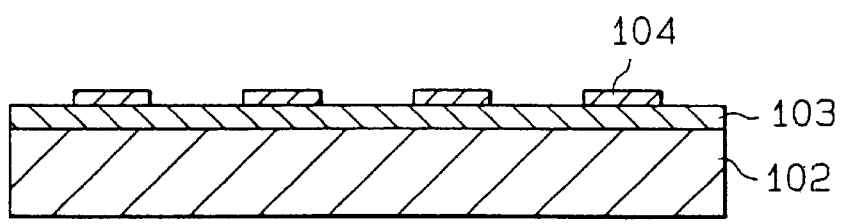
Figure 21D:
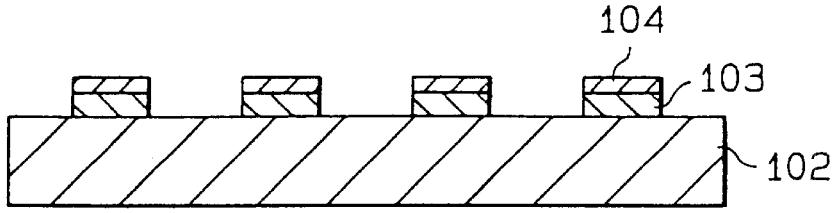
Figure 21E:
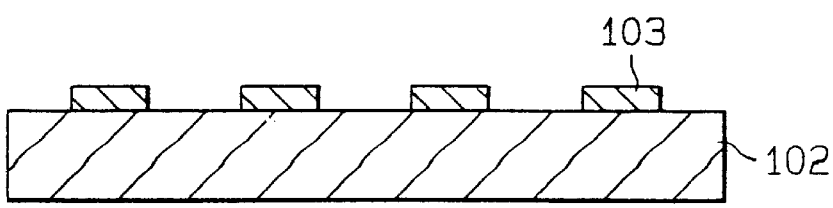

Specifically, as show in FIG. 21A, the metallic film pattern 100 having be naturally separated from the first substrate is bonded to the transparent adhesive sheet 101. On the other hand, a metallic film 103 is formed on the wafer state second substrate 102, and a photosensitive resin material 104 such as photo resist is coated on the metallic film 103. Then, as shown in FIG. 21B, the adhesive sheet 101 is bonded to the substrate 102, and light is irradiated to the resin material 104 through the metallic film pattern 100. Next, as shown in FIG. 21C, the adhesive sheet 101 is stripped. At that time, parts of the resin material 104 where light has been irradiated are removed together with the adhesive sheet 101. Then, as shown in FIG. 21D, the metallic film 103 is etched using the remaining resin material 104 as a mask. Finally, as shown in FIG. 21E, the resin material 104 is removed. Thus, the separated metallic film pattern 100 can be used as a mask for patterning the resist material 104.

Otherwise, after the metallic film pattern 100 is bonded to the substrate 102 through the metallic film 103 and the resin material 104 made of adhesive material as shown in FIG. 21B, etching may be performed through the adhesive sheet 101 and the metallic film pattern 100 to transfer the metallic film pattern 100 onto the substrate 102 as shown in FIG. 21E directly.

The present invention is not limited to the patterning of the conductive member on the semiconductor substrate (wafer) for forming an electrode, a wiring member, or the like, but may be applied to pattering of conductive members on other base members such as a printed circuit board.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A method for manufacturing a semiconductor device, comprising:

preparing a substrate having an insulation portion and a conductive portion both of which are exposed on a surface of the substrate;

forming a metallic film on the substrate while controlling a total stress of the metallic film, the metallic film including a first portion contacting the insulation portion and a second portion contacting the conductive portion; and removing the first portion of the metallic film from the insulation portion while leaving the second portion on the conductive portion.

2. The method of claim 1, wherein the total stress of the metallic film is controlled to be approximately larger than 100 N/m so that only the first portion of the metallic film is removed from the substrate.

3. The method of claim 1, where in the metallic film includes at least one of titanium, vanadium, chromium, cobalt, zirconium, aluminum, tantalum, tungsten, and platinum.

4. The method of claim 1, wherein the conductive portion includes one of silicon and aluminum, and the insulation portion includes silicon dioxide.

5. A method for manufacturing a semiconductor device comprising:

preparing a substrate having an insulation portion and a conductive portion both of which are exposed on a surface of the substrate;

forming a metallic film on the substrate, the metallic film including a first portion contacting the insulation portion and a second portion contacting the conductive portion;

forming, a stress adjustment film on the metallic film to control a stress at an interface between the first portion of the metallic film and the insulation portion;

removing the first portion of the metallic film from the insulation portion while leaving the second portion of the metallic film on the conductive portion.

6. The method of claim 5, wherein the stress adjustment film is made of metal.

7. The method of claim 6, wherein the stress adjustment film is made of nickel.

8. The method of claim 5, wherein the stress adjustment film includes at least one of nickel, copper, and palladium.

9. The method of claim 5, wherein the metallic film and the stress adjustment film laminating with one another has a total stress approximately larger than 100 N/m.

10. The method of claim 5, wherein the conductive portion is one of an impurity diffusion region provided in a surface portion of the substrate, and a metallic film disposed on the substrate.

11. The method of claim 5, wherein the conductive portion is a metallic film containing aluminum.

12. The method of claim 5, further comprising:

forming a protective film on the substrate, after removing the first portion of the metallic film; and forming an opening portion in the protective film for exposing a region corresponding to the conductive portion from the opening portion.

13. The method of claim 12, further comprising disposing a solder on the region exposed from the opening portion.

14. The method of claim 13, further comprising forming a soldering metallic film on the stress adjustment film before the protective film is formed, the soldering metallic film having wettability to the solder higher than the stress adjustment film and exposed at the region from the opening portion to contact the solder.

15. The method of claim 14, wherein the soldering metallic film is made of one selected from a group consisting of gold, copper, silver, platinum, iron, tin, and nickel-vanadium alloy.

16. The method of claim 5, wherein the first portion of the metallic film is removed by an adhesive sheet.

17. The method of claim 5, wherein the first portion of the metallic film is naturally removed from the insulation portion.

18. The method of claim 17, further comprising:

bonding the first portion of the metallic film, which is removed from the substrate as a first substrate, onto an adhesive sheet; and disposing the first portion of the metallic film on a second substrate.

19. The method of claim 17, further comprising transferring a pattern of the first portion, which is removed from the substrate as a first substrate, onto a second substrate.

20. The method of claim 5, where in the metallic film includes at least one of titanium, vanadium, chromium, cobalt, zirconium, aluminum, tantalum, tungsten, and platinum.

21. The method of claim 5, wherein the metallic film has a thickness approximately less than 500 nm.

22. A method of patterning a film, comprising:

preparing a member having a surface, the surface including a first surface portion made of a first material and a second surface portion made of a second material different from the first material;

forming a film on the first surface portion and the second surface portion of the member, and providing a stress adjustment film to have a total stress which controls a difference between a first adhesion of the film with respect to the first surface portion and a second adhesion of the film with respect to the second surface portion; and removing a first film portion of the film from the first surface portion while leaving a second film portion of the film on the second surface portion.

23. The method of claim 22, wherein:

the first material is an insulation material;

the second material is one of metal, silicon, and silicon nitride; and the film is a metallic film.

24. The method of claim 23, wherein the film includes at least one of titanium, vanadium, chromium, cobalt, zirconium, aluminum, tantalum, tungsten, and platinum.

25. The method of claim 22, wherein:

the first material is silicon oxide; and the second material is silicon nitride.

26. The method of claim 22, further comprising:

adhering an adhesive sheet on to the film formed on the member; and stripping the adhesive sheet from the member so that the first film portion is removed from the first surface portion together with the adhesive sheet and so that the second film portion remains on the second surface portion against an adhesive strength of the adhesive sheet.

27. The method of claim 26, further comprising transferring the first film portion, which is removed from the first surface portion, onto a substrate.

28. The method of claim 27, wherein the first film portion transferred onto the substrate is fixed to the substrate by an adhesive interposed therebetween.

29. The method of claim 27, wherein the first film portion transferred onto the substrate is fixed to the substrate by a compound formed at an interface between the first film portion and the substrate.

30. The method of claim 26, further comprising transferring a pattern of the first film portion onto a photosensitive resin member disposed on the substrate by irradiating the photo sensitive resin member with light through the first film portion.

31. The method of claim 22, wherein the total stress of the film is controlled by a thickness of the film.

32. The method of claim 31, wherein the film includes a nickel film.

33. The method of claim 32, wherein:
the film includes a first film directly contacting the first surface portion and the second surface portion of the member, and having a deoxidizing property; and
the nickel film is disposed on the first film.

34. The method of claim 33, wherein the first film has a thickness approximately less than 500 nm.

35. The method of claim 33, wherein the nickel film has a thermal expansion coefficient larger than the first film.

36. The method of claim 33, wherein a difference in thermal expansion coefficient between the first film and the surface of the member is smaller than a difference in thermal expansion coefficient between the nickel film and the surface of the member.

37. The method of claim 33, wherein the first film is made of titanium.

38. The method of claim 22, wherein the film includes a first film directly contacting the first surface portion and the second surface portion of the member, the first film having a deoxidizing property.

39. The method of claim 38, wherein the first film is made of titanium.

40. A method for patterning a metallic film, comprising:
preparing a silicon wafer having a surface, the surface including a first surface portion made of an insulation material and a second surface portion made of one of metal and silicon;
forming a metallic film, which comprises a stress adjustment layer, on the surface of the silicon wafer the metallic film having a total stress which is increased on the first surface portion and the second surface portion for decreasing an adhesion between the metallic film and the first surface portion;
adhering an adhesive sheet to the silicon wafer with the metallic film interposed there between; and
stripping the adhesive sheet from the silicon wafer to remove the metallic film from the first surface portion and to leave the metallic film on the second surface portion.

41. The method of claim 40, wherein the total stress of the metallic film is controlled by a thickness of the metallic film.

42. The method of claim 40, wherein the metallic film includes a nickel film.

43. The method of claim 40, wherein the metallic film includes a film portion directly contacting the first surface portion and the second surface portion, the film portion having a deoxidizing property.

44. The method of claim 43, wherein the film portion is made of selected from titanium, vanadium, chromium, cobalt, zirconium, aluminum, tantalum, tungsten, and platinum.

45. The method of claim 43, wherein the film portion is made of titanium.

46. The method of claim 40, wherein the metallic film is formed to have the total stress in a range of approximately 100 N/m to 1500 N/m.

47. The method of claim 40, wherein the metallic film is made of platinum.

48. The method of claim 47, wherein the metallic film has a thickness larger than approximately 220 nm.

* * * * *